(12) United States Patent
Howard et al.

(10) Patent No.: US 7,462,783 B2
(45) Date of Patent: Dec. 9, 2008

(54) SEMICONDUCTOR PACKAGE HAVING A GRID ARRAY OF PIN-ATTACHED BALLS

(75) Inventors: Gregory E. Howard, Dallas, TX (US); Navin Kalidas, Houston, TX (US); Paul J. Hundt, Garland, TX (US); Gary P. Morrison, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 10/910,506

(22) Filed: Aug. 2, 2004

(65) Prior Publication Data

US 2006/0021795 A1    Feb. 2, 2006

(51) Int. Cl.
*H05K 1/16* (2006.01)
(52) U.S. Cl. .................. 174/260; 174/262
(58) Field of Classification Search ........... 174/261, 174/260, 262, 268, 266, 267, 255, 254, 250; 361/791, 792, 793, 794, 795, 760, 767, 772, 361/779, 803; 257/778
See application file for complete search history.

(56) References Cited

U.S. PATENT DOCUMENTS

| | | | | |
|---|---|---|---|---|
| 3,880,486 | A | * | 4/1975 | Avakian ...................... 439/75 |
| 4,347,552 | A | * | 8/1982 | Pearcy et al. ............... 361/749 |
| 4,420,877 | A | * | 12/1983 | McKenzie, Jr. .............. 29/739 |
| 4,871,583 | A | * | 10/1989 | Monnier ...................... 29/852 |
| 4,976,626 | A | * | 12/1990 | Dibble et al. ................. 439/67 |
| 5,115,375 | A | * | 5/1992 | Garay ......................... 361/760 |
| 5,165,984 | A | * | 11/1992 | Schoenthaler ............... 428/209 |
| 5,338,208 | A | * | 8/1994 | Bross et al. .................... 439/66 |
| 5,538,433 | A | * | 7/1996 | Arisaka ........................ 439/70 |
| 5,656,798 | A | * | 8/1997 | Kubo et al. ................. 174/265 |
| 6,061,240 | A | * | 5/2000 | Butterbaugh et al. ........ 361/704 |
| 6,465,748 | B2 | * | 10/2002 | Yamanashi et al. .......... 174/262 |
| 6,593,535 | B2 | * | 7/2003 | Gailus ......................... 174/262 |
| 6,700,079 | B2 | * | 3/2004 | Bogursky et al. ........... 174/268 |
| 6,734,371 | B2 | * | 5/2004 | Arrigotti et al. ............. 174/260 |
| 6,790,056 | B2 | * | 9/2004 | Buondelmonte et al. ...... 439/83 |
| 6,896,526 | B2 | * | 5/2005 | Pitzele ........................ 439/83 |

* cited by examiner

*Primary Examiner*—Ishwar (I. B.) Patel
(74) *Attorney, Agent, or Firm*—Yingsheng Tung; Wade James Brady, III; Frederick J. Telecky, Jr.

(57) ABSTRACT

Semiconductor chip (1101) of a ball grid array device (1100) is mounted onto tape substrate (1102) using attach adhesive (1103). The metal layer on the top surface of substrate (1102) uses between about 30% to 90% of its area for connecting lines (1104), and only the remainder for members/rings (1105) and terminals (1106). Routing of differential pair signals and large numbers of signals on a single layer tape package are feasible. This embodiment creates an inexpensive high performance tape ball grid array package for chip-scale devices. Terminals (1106) serve the connection (by bonding wires or reflow bumps) to the chip contact pads. Inserted in members/rings (1105) are the conductive pins (1107), which serve as anchors for the solder bodies/balls (1108). Pins (1107) are substantially insensitive to the thermomechanical stresses, which occur in device (1100) during assembly, testing and operation.

10 Claims, 4 Drawing Sheets

SEMICONDUCTOR PACKAGE HAVING A GRID ARRAY OF PIN-ATTACHED BALLS

FIELD OF THE INVENTION

The present invention is related in general to the field of semiconductor devices and processes and more specifically to structure and assembly method of tape-based high-density routing ball grid array packages featuring high reliability.

DESCRIPTION OF THE RELATED ART

A popular family of the semiconductor ball grid array packages uses a flexible tape as substrate. On one side (typically the bottom side) of this tape is an array of solder balls/bumps assembled for the package connection to external parts, and on the opposite side (typically the top side) of the tape is the semiconductor chip attached. In standard technology, one metal layer on the chip side of the tape provides the routing lines, further the terminals for attaching the interconnecting members to the chip assembly pads, and finally the contact pads for attaching the solder balls. The latter pads are exposed by pre-punched holes in the tape so that the solder balls/bumps can be attached from the bottom side.

There are a number of issues with this package construct, driven by the market trends towards higher ball/bump counts, higher device reliability, and higher performance/speed. In order to ensure solder joints which can reliably withstand the thermomechanical stresses of temperature cycling, the hole and the solder contact pads have to be typically at least about 0.5 ball diameter.

The thermomechanical stress problems start with the reflow process needed to attach the solder to the contact pads. The problems are often aggravated by unfavorable height-to-diameter ratios and/or lack of uniformity of the solder balls/bumps.

In some device types, about 60% of the top tape area is consumed by the solder contact pads. Obviously, the lack of available space makes the routing of the ball grid array package difficult, especially when high speed traces have to be accommodated. Further, lack of space may impose a routing layout not favorable for high frequency lines. For chip-scale packages, these constraints become especially burdensome.

SUMMARY OF THE INVENTION

This invention addresses the need for a coherent concept of ball grid package structure and fabrication method, how to assemble high lead count and preferably chip-scale devices. Packages based on this concept as disclosed by the present invention provide excellent electrical performance, mechanical stability, and high product reliability. It is a technical advantage of the invention that the fabrication method is flexible enough to be applied for different semiconductor product families and a wide spectrum of design and process variations. It is further an advantage that the innovations can be accomplished while shortening production cycle time and increasing throughput.

One embodiment of the invention is a substrate for the assembly of semiconductor devices. The substrate has first and second surfaces and comprises a sheet-like base of insulating material, preferably compliant. A plurality of connecting lines are on the first substrate surface, selected lines interconnecting conductive members, preferably rings, and terminals. A conductive pin, having a head on one end, is in each of these members so that the pin extends through the substrate base and protrudes from the second surface, while its head rests on its respective member. The protruding pin has a surface composition metallurgically suitable for solder attachment.

Another embodiment of the invention is a semiconductor assembly with a substrate as described above and an integrated circuit chip with its contact pads connected to the substrate terminals. The conductive pins extending through the substrate have a separate body of solder material attached to their protruding ends, providing strong mechanical solder attachment. Since the pins anchoring of the solder bodies require much less substrate area than the traditional solder-on-metal joints, these area savings can now be devoted to more generous interconnecting line layouts.

Another embodiment of the invention is a method for fabricating a substrate for the assembly of semiconductor devices. First, a sheet-like base of insulating material is provided, the base having first and second surfaces. Then, a plurality of connecting lines is formed on the first surface so that selected lines interconnect conductive members and terminals. Finally, a conductive pin, having a head on one end, is inserted in each of the members so that the pin penetrates through the base until it protrudes from the second surface and the pin head rests on the member. It is preferable for some base materials to heat the sheet-like base approximately to the temperature of the elastic limit of the material, before the pins are inserted and pushed through.

In another embodiment of the invention, a semiconductor device is assembled by providing the substrate with the pins as described above and further providing an integrated circuit chip having contact pads. The contact pads and the substrate terminals are connected, respectively, either by wire bonding or by bump bonding. A separate body of solder material is attached to each protruding pin, preferably so that the pin penetrates the solder body at least halfway. A preferred attachment method aligns the solder material with respect to the protruding substrate pins, applies thermal energy to reach the solder reflow temperature, and brings assembly and spheres in a position to insert each protruding pin into its corresponding solder sphere.

Compared to the conventional solder joint attachment, which typically requires at least 0.5 solder sphere diameter, the nail attachment according to the invention requires only about 0.1 to 0.3 sphere diameter.

It is a technical advantage that the invention provides a method of assembling high density, high input/output, high speed ICs in packages which may have a need for low profile. These ICs can be found in many device families such as processors, digital and analog devices, wireless and most logic devices, high frequency and high power devices, especially in large chip area categories. Another technical advantage of the invention is it provides the semiconductor devices with great insensitivity to thermo-mechanical stress, and thus high operational device reliability. It thus offers the possibility to reduce the required size of the solder spheres.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
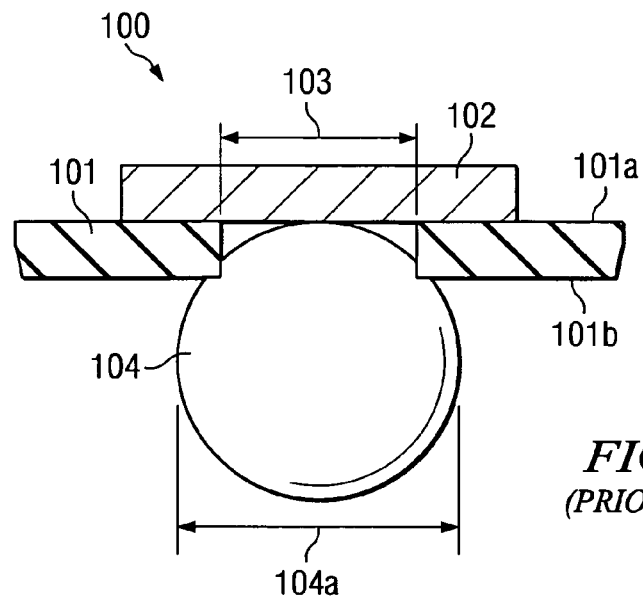
FIG. 1 shows a schematic cross section of a portion of a semiconductor package substrate having solder ball and attachment pad, in known technology.

The impact of the present invention can be most easily appreciated by highlighting the shortcomings of the known technology. As a typical example of the known technology, the schematic cross section of FIG. 1 illustrates a solder-ball (solder bump) connection generally designated 100. In this connection, a substrate 101 with first surface 101a and second surface 101b has a metal layer on first surface 101a. The patterned portion 102 of this metal layer is exposed by a substrate window of diameter 103. This exposed layer portion is contacted by a solder body ("ball", bump) 104, shown in FIG. 1 after attachment but before reflow; layer portion 102 is thus referred to as "contact pad".

The dimensions of opening 103 are related to the diameter 104a of the solder body and the need of creating a large enough interface between body 104 and metal 102 to insure a reliable solder joint. As a consequence of this reliability requirement, window 103 and thus layer portion 102 consume significant amounts of area. In the schematic top view of FIG. 2, substrate 101 is shown with the large diameter opening 103. Typically, opening 103 has to be sized from about 50% to about 75% of solder diameter 104a.

Figure 3:
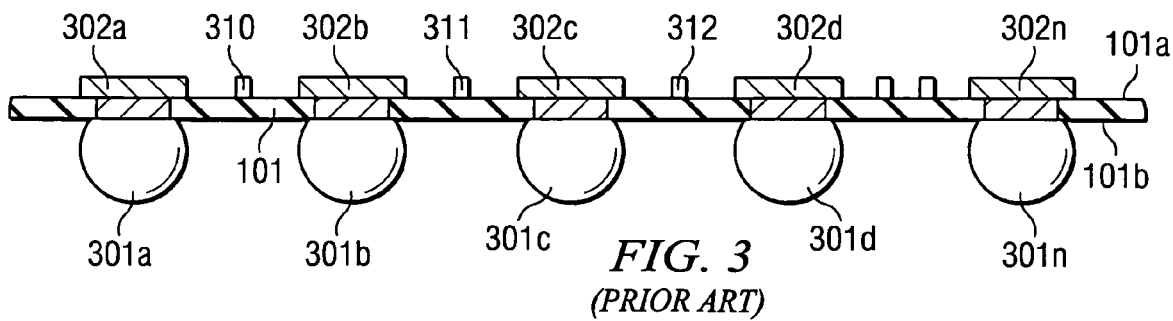
FIG. 3 shows a schematic cross section of a portion of a semiconductor package substrate with patterned metallization on one surface and attached solder balls on the opposite surface, in known technology.
Figure 4:
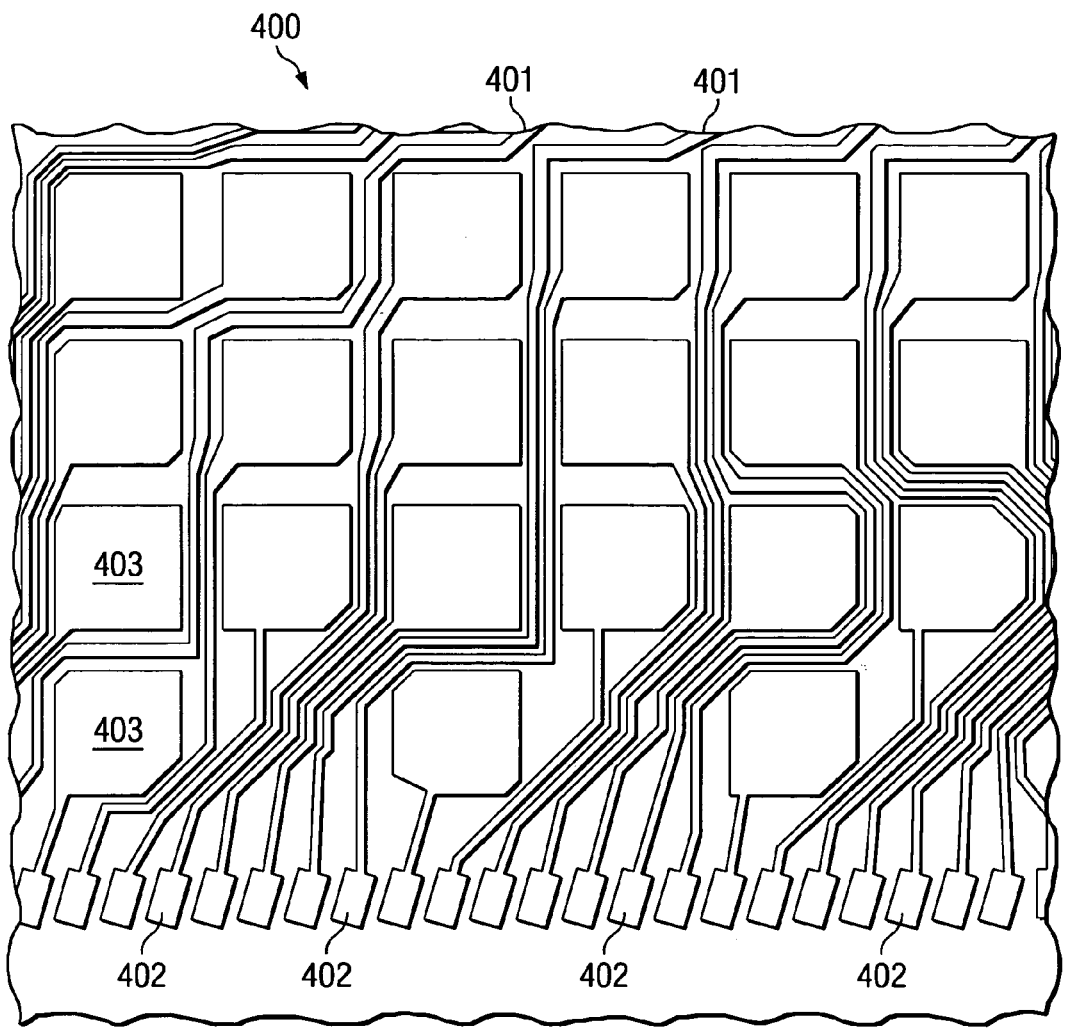
FIG. 4 is a top view of a portion of the patterned substrate metallization in known technology, indicating connecting lines and solder contact pads.

When a plurality of solder bodies 301a, 301b, . . . , 301N is attached to substrate 101, as shown schematically in the cross section of FIG. 3, the majority of the metal layer on substrate surface 101a is consumed as contact pads 302a, 30ab, . . . , 302N. Little space of the metal layer on substrate surface 101a is left for providing electrically connecting or routing lines 310, 311, 312, etc. Typically, the area left for routing lines is only about 30%. This severe limitation is further illustrated in the schematic top view of FIG. 4, which depicts a portion, generally designated 400, of a typical layout of routing lines on the surface of a commercial semiconductor package substrate. The routing lines 401 have I/O terminals 402. The lines connect to the contact pads 403 for the solder bodies (typically solder balls or bumps). FIG. 4 clearly demonstrates that due to the necessarily large area of these solder contact pads 403, the space available for the interconnecting lines 401 is quite limited. This fact causes severe constraints for high frequency devices, which need shielded lines and/or lines with only few kinks and bendings.

Figure 5:
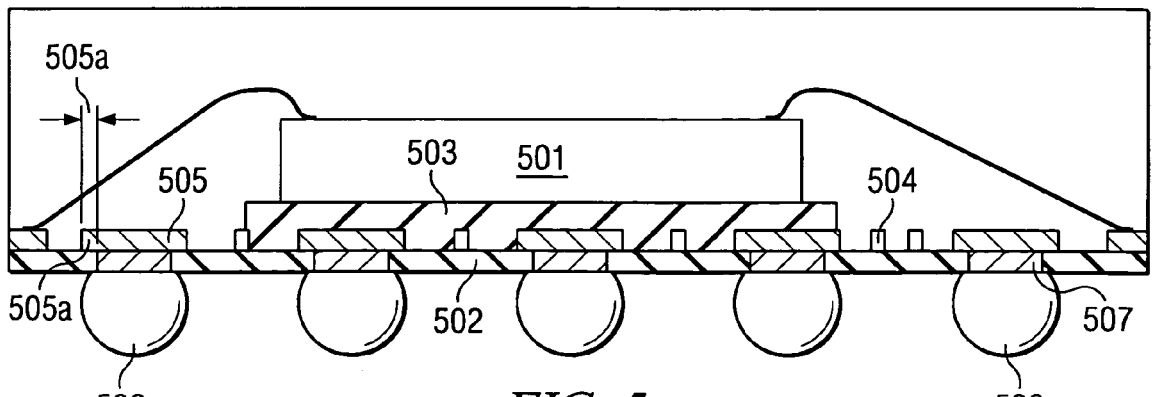
FIG. 5 shows schematically a cross section of a tape ball grid array in known technology.

As a consequence, the number of solder balls, which can be accommodated for a finished device, may be severely restricted. The schematic cross section of FIG. 5 illustrates a typical standard tape ball grid array package, such as the microStar™ package. Semiconductor chip 501 is mounted onto tape substrate 502 using attach adhesive 503 (usually an insulator). The one metal layer, usually copper, on the top surface of substrate 502 uses typically <50% of its area for connecting lines 504, but >50% for contact pads 505 with the solder balls 506. Solder balls 506 achieve the contact with pad 505, and the formation of solder joints, through pre-punched holes 507 in tape 502. The holes 507 have to be large enough to allow wide solder joints capable of withstanding specified thermomechanical stresses. For acceptable thermomechanical joint reliability, the diameter of holes 507 has to be typically >0.5 ball diameter. When the copper overlap 505a of hole 507 is included, typically >50% of the topside of tape 502 is taken up with the contact pads 505 of the solder balls 506 of the package. This need leaves <50% of the substrate metal for connecting lines 504. Consequently, very little room is left for routing high speed traces within the package—a severe shortcoming for high frequency devices.

Figure 6:
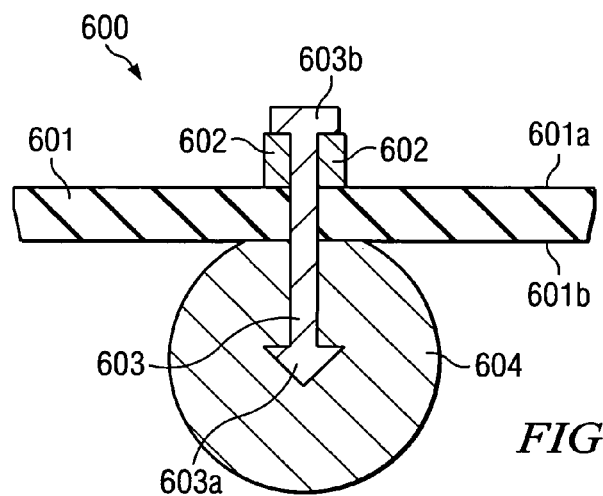
FIG. 6 shows a schematic cross section of a portion of a semiconductor package substrate having solder ball and conductive attachment pin, according to an embodiment of the invention.

The schematic cross section of FIG. 6 illustrates an embodiment of the present invention. A substrate, generally designated 600, for the assembly of semiconductor devices has a sheet-like base 601 of insulating material with first surface 601a and second surface 601b. Preferably, base material 601 is compliant and has a thickness in the range from about 10 to 100 μm; a preferred material comprises polyimide or a derivative polymer compound. In other embodiments, base 601 may be stiff. For both the compliant and stiff characteristics, the materials are preferably selected to stay in the elastic regime of the stress/strain diagram during device assembly and device operation.

On surface 601a is positioned a patterned metal layer, preferably copper in the thickness range from about 5 to 35 μm; only a portion 602 of this layer is shown in FIG. 6, which is generally described as a member and more specifically may be formed as a ring, shown in cross section in FIG. 6.

A conductive pin 603 reaches through base 601 and member 602. On one end, pin 603 has a pointed tip 603a, and on the other end a head 603b. Preferably, the conductive pins are made of copper and have a diameter between about 15 and 100 μm. (More about shape and surface conditions of pins see FIG. 8). Pin 603 extends through base 601 and protrudes from second surface 601b; pinhead 603b rests on member 602. Actually, pinhead 603b presses onto member 602 due to the pulling force, which base 601 exerts on pin 603, originated by the method of pin insertion (see below).

As FIG. 6 indicates, a separate body of solder material 604 is attached to each pin. Specifically, the length of pin 603 is selected so that the tip 603a reaches approximately to the center of the attached solder body 604. Consequently, solder body 604 is solidly anchored on pin 603. This feature provides reliable electrical contact form solder body 604 through pin 603 to member 602. If the solder body has about spherical shape, the body touches second surface 601b of base 601. There is, however, no extra hole in base 601 needed to establish electrical contact between solder 604 and member 602 and the metal layer on surface 601a; pin 603 provides this contact.

Figure 2:
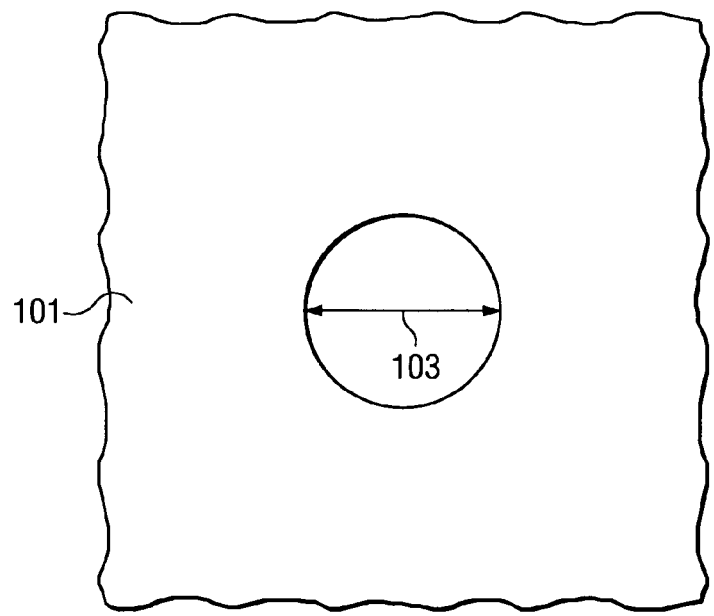
FIG. 2 is a schematic top view of the hole in the substrate base to accommodate the solder ball, in known technology.
Figure 7:
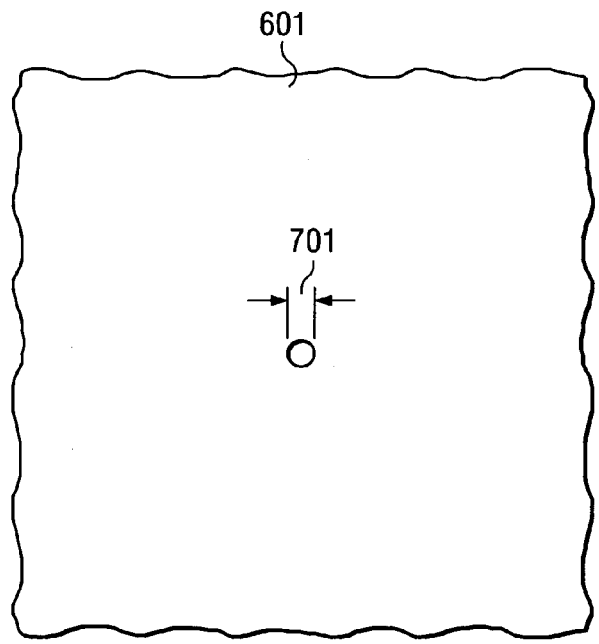
FIG. 7 is a schematic top view of the hole in the substrate base to accommodate the conductive pin, according to an embodiment of the invention.

The diameter of pin 603 determines the hole size created by pin 603 during its insertion method through substrate base 601. In the top view of FIG. 7, substrate base 601 is illustrated having a pinhole of diameter 701. A comparison of diameter 701 and the conventional punched hole of diameter 103 in FIG. 2 illustrates the savings in tape area provided by the embodiment of the invention in FIG. 6. This area savings is now available to be used by additional interconnecting lines formed from the metallization on surface 601a of tape 601.

Figure 8:
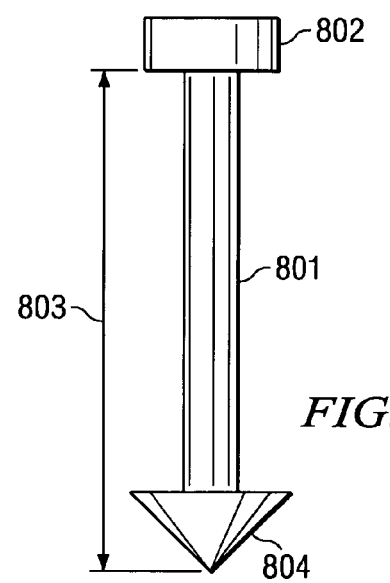
FIG. 8 shows schematically a cross section of the solder attachment pin, according to another embodiment of the invention.

The pin 801 shown in cross section in FIG. 8 has not only head 802 and length 803, but also a tip 804 formed as an arrowhead. The shape of the arrowhead is preferably formed so that it provides additional mechanical hold for the attached solder ball, while not impeding the insertion of the pin through the tape or even rupturing the tape during pin insertion. It is preferred that the surface of pin 801 comprises a material suitable for solder wetting; preferably, the material is selected from a group consisting of nickel, gold, palladium, or alloys thereof. For some applications, it is preferred that the head 802 of pin 801 is coated with a thin layer of solder such as tin or tin alloy in order to provide a soldered contact between pinhead 802 and the conductive member 602 of the substrate metallization.

Figure 9:
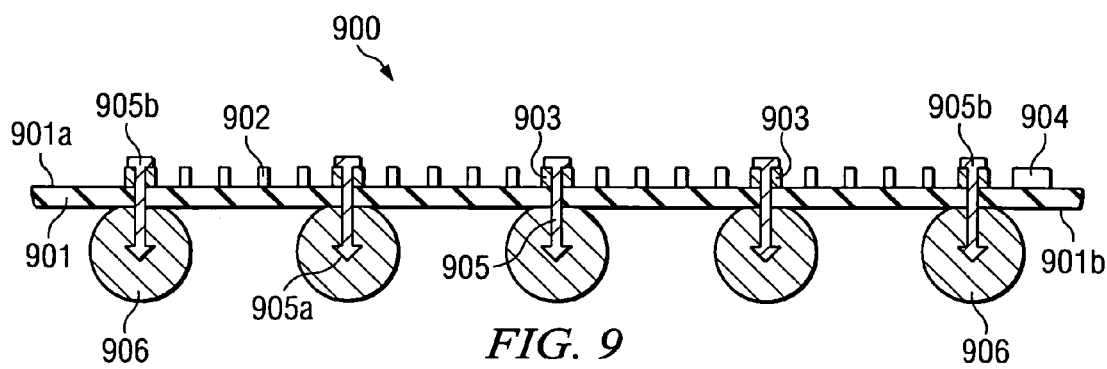
FIG. 9 illustrates a schematic cross section of a portion of a semiconductor package substrate with patterned metallization highlighting connecting line density, conductive pins, and attached solder balls, according to an embodiment of the invention.

The schematic cross section of FIG. 9 illustrates an embodiment of the invention comprising a portion, generally designated 900, of a substrate for the assembly of semiconductor devices. Substrate 900 has a sheet-like base 901 of insulating material, which is preferably compliant, in the thickness range from about 10 to 100 μm, and comprise polyimide or a derivative polymer compound. In other embodiments, base 901 may be stiff. Base tape 901 has first surface 901a and second surface 901b and a metal layer on first surface 901a. This metal layer is preferably made of copper and patterned in a plurality of connecting lines 902, a plurality of conductive members 903, and a plurality of terminals 904. A preferred shape of conductive members 903 is a ring. The members may be arranged in an array, for instance in an array as standardized for a ball grid array package. Selected lines 902 are interconnecting conductive members 903 and terminals 904. In some applications, terminals 904 are suitable as contact pads for wire bonding; in other applications, terminals 904 are suitable for metallic bump connections. An embodiment having wire-bonded chip connection is schematically shown in FIG. 11.

FIG. 9 shows a conductive pin 905 in each of the members 903. Pins 905 have a tip 905a and a head 905b. Pins 905 extend through substrate base 901 and protrude from second base surface 901b, while head 905b rests on one of the members 903. Each protruding pin 905 has a surface composition metallurgically suitable for solder attachment. As FIG. 9 indicates, a separate solder body 906 is attached to each protruding pin. Preferably, these solder bodies 906 have an approximate spherical shape; they may generally be bumps. The length of pins 905 is sufficient to penetrate the attached solder body 906 at least halfway.

By using a pin as illustrated in the assembly of FIG. 9, the diameter of the conductive connection from solder body/ball 906 to tape metal layer member 903 is only about 5 to 25% of the ball diameter, as compared to the conventional via connection of 50 to 75% of the same ball diameter. Thus, the area available for routing lines increases from about 30% to about 90%; in the example of a 0.5 mm ball pitch package, this reduction corresponds to a routing density increase for the connecting lines from around 150 μm to around 350 μm. Consequently, much more routing variability is feasible, for instance the creation of tape ball grid array packages for high performance differential pair routing.

Figure 11:
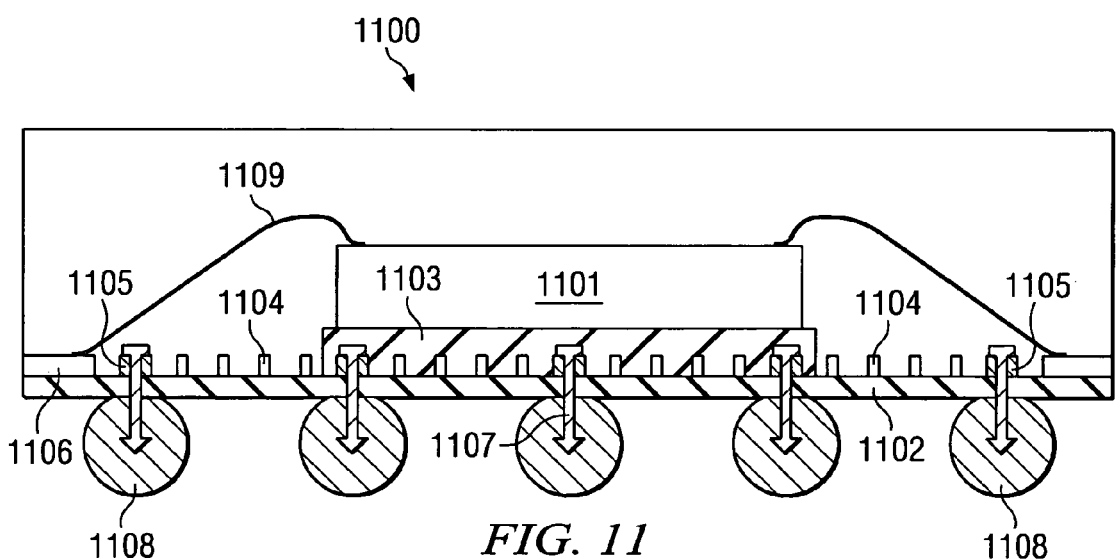
FIG. 11 shows schematically a cross section of a tape ball grid array according to the invention.

FIG. 11 shows schematically a device example, generally designated 1100, of a ball grid array embodiment utilizing the increased routing density of the connecting lines. Semiconductor chip 1101 is mounted onto tape substrate 1102 using attach adhesive 1103 (usually a polyimide or epoxy). The one metal layer, usually copper, on the top surface of substrate 1102 uses between about 30% to 90% of its area for connecting lines 1104, and only the remainder for members/rings 1105 and terminals 1106. Routing of differential pair signals and large numbers of signals on a single layer tape package are feasible. This embodiment creates an inexpensive high performance tape ball grid array package for chip-scale devices. The terminals 1106 serve the connection (by bonding wires or reflow bumps) to the chip contact pads. Inserted in members/rings 1105 are the conductive pins 1107, which serve as anchors for the solder bodies/balls 1108. Pins 1107 are substantially insensitive to the thermomechanical stresses, which will occur in device 1100 during assembly, testing and operation.

Figure 10:
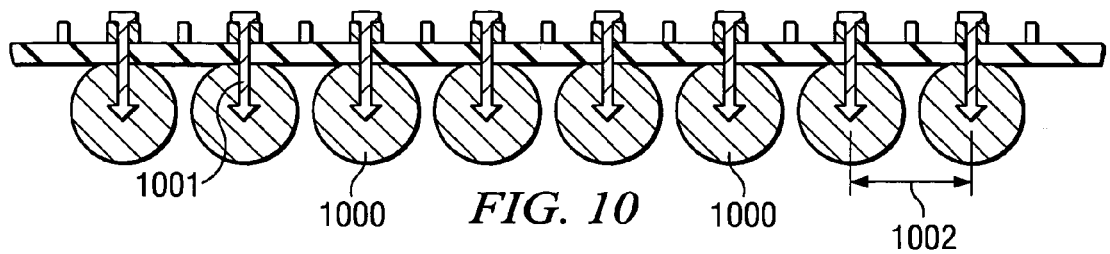
FIG. 10 illustrates a schematic cross section of a portion of a semiconductor package substrate with patterned metallization, conductive pins, and attached solder balls highlighting solder ball density, according to another embodiment of the invention.

As another substrate embodiment, FIG. 10 depicts how the solder ball attachment by means of pins can be exploited to increase the number of solder connections, or to reduce the package size needed to accommodate a required number of solder connections. By shrinking the size of solder bodies 1000 and shortening the length of pins 1001, the distance 1002 between neighboring connections can be reduced, leading to a higher connection density. As an example, there is a reduction of about 50% between the embodiments shown in FIGS. 9 and 10. The preferred spacing of the solder bodies, center to center, is between about 50 and 1500 μm.

Figure 12:
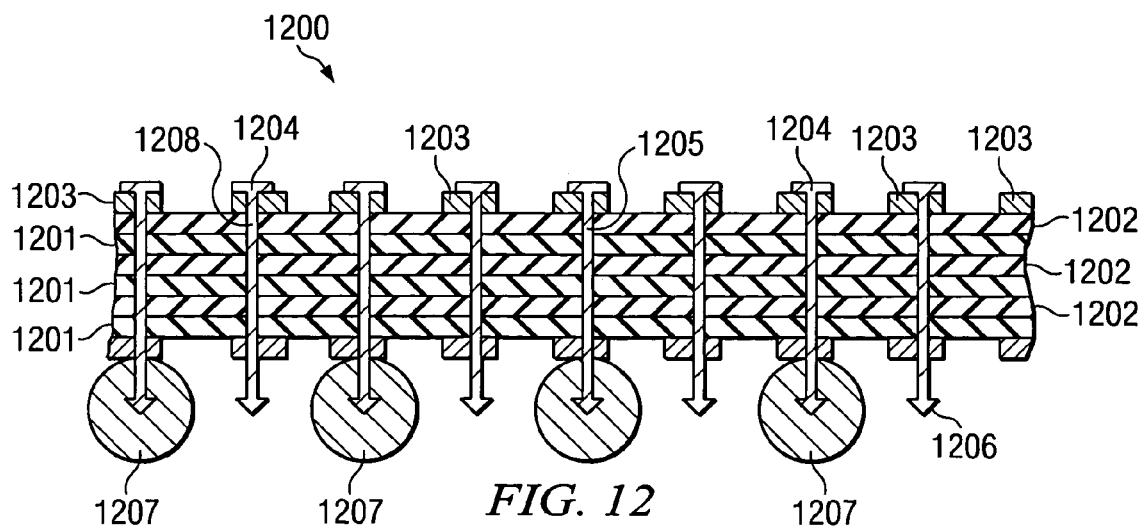
FIG. 12 is a schematic cross section of a portion of a multiplayer substrate according to another embodiment of the invention.

In another embodiment, schematically exemplified in the cross section of FIG. 12, the sheet-like substrate base, generally designated 1200, has more than one metal layer. Such multiplayer substrate may have, for instance, a laminated stack of alternating insulating layers 1201 and conducting layers 1202. One of the metal layers is patterned to form the members 1203 (for example, ring-shaped), which are contacted by the heads 1204 of pins 1205. In FIG. 12, pins 1205 have tips 1206, which have solder bodies/balls 1207 attached. Optional extra pins 1208 are outside the ball connections; each of these pins also has a head and a tip.

Another embodiment of the invention is a method for fabricating a substrate for the assembly of semiconductor devices. The method comprises the steps of providing a sheet-like base of insulating material; the base has first and second surfaces. A plurality of connecting lines is formed on the first surface so that selected lines interconnect conductive members, and terminals. A conductive pin, which has a head on one end, is then inserted in each of the members so that the pin penetrates through the base until it protrudes from the second surface and the pinhead rests on the member. It is preferred that, before the step of inserting the pin, the sheet-like base is heated approximately to the temperature of the elastic limit of the base material. It has been found that the elevated temperature facilitates the pin insertion, and that in the subsequent cooling cycle, the internal forces specific to the compliant base material hold the penetrated pin in place, securing stable contact with the metal members/rings.

Another embodiment of the invention is a method for fabricating a semiconductor assembly. A sheet-like substrate of insulating material is provided, which has first and second surfaces. A metal layer on the first surface is patterned into a plurality of connecting lines, wherein selected lines interconnect conductive members and terminals, which have also been formed from the metal layer. A conductive pin, which has a head on one end and a surface composition metallurgically suitable for solder attachment is then inserted in each of the members so that the pin extends through the substrate and protrudes from the second surface and the head rests on one of the members.

Next, an integrated circuit chip with contact pads is provided. The pads are connected to the terminals, respectively; preferred methods include wire bonding after the chip has been attached to the first substrate surface, and metallic bump bonding after the chip has been flipped. Finally, a separate body of solder material is attached to each of the protruding pins.

A preferred way of solder attachment is to provide a plurality of bodies of solder material spaced to correspond one by one to the pins protruding from the second substrate surface. A preferred method utilizes a non-wettable carrier, onto which the solder bodies are placed so that they are spaced from each other. Then, thermal energy is applied to reach the reflow temperature of the solder material so that each body forms an approximate sphere. The substrate and the spheres are aligned so that each pin is aligned with its corresponding solder sphere. The assembly and the plurality of solder spheres are brought in a position to insert each protruded pin into its corresponding solder sphere, and to wet the solder on the pin surface. Finally, the assembly and the attached solder spheres are cooled to create reliable solder-to-substrate attachment. For many device types, chip and first substrate surface are encapsulated, preferably in a transfer molding process.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the base material of the substrate may be stiff instead of compliant; preferably, the temperatures used in the pin insertion process remain within the elastic regime of the material.

As another example, the pin tip may be designed as a hook to provide good mechanical contact to the solder balls of the package.

As another example, the pins may be heated in the pin-into-solder insertion process to facilitate easy insertion and to eliminate the solder reflow step associated with attaching the ball to the package.

As another example, the encapsulation compound may be added after the solder bodies are attached.

It is therefore intended that the appended claims encompass any such modifications or embodiments.

We claim:

1. A substrate for the assembly of a semiconductor device, comprising:
    a substrate of an insulating material having a pattern of conductive film on a top surface including elongated traces connecting terminals and rings, each ring adjacent a hole on the substrate;
    a conductive pin disposed in each hole, secured by the substrate frictionally;
    the pins having a head larger than the hole, contacting the rings, and a pointed tip protruding outwardly from a second surface of the substrate opposing the top surface; and
    a partially spherical solder body attached to each protruding portion of the pins, having a radius approximately equaling the length of the protruding portion of the pins.

2. The substrate for the assembly of a semiconductor device of claim 1, in which each hole has a radius not longer than 25% of the radius of the solder body.

3. The substrate for the assembly of a semiconductor device of claim 1, in which each hole has a radius about 5% of the radius of the solder body.

4. The substrate for the assembly of a semiconductor device of claim 1, in which accumulated area of the rings occupies less than 70% of the substrate.

5. The substrate for the assembly of a semiconductor device of claim 1, in which accumulated area of the rings occupies approximately 10% of the substrate.

6. The substrate for the assembly of a semiconductor device of claim 1, in which the conductive traces include routing of differential pair signals.

7. The substrate for the assembly of a semiconductor device of claim 1, in which the pointed tip of the pins has a arrowhead shape.

8. The substrate for the assembly of a semiconductor device of claim 1, in which the head of the pins are secured on the rings with solder material.

9. The substrate for the assembly of a semiconductor device of claim 1, in which the substrate includes multiple layers of insulating material and multiple layers of conductive film pattern disposed alternately.

10. The substrate for the assembly of a semiconductor device of claim 1, in which conductive wires connect contact pads of the semiconductor device and the terminals.

* * * * *